US012588316B2

(12) United States Patent
Kryliouk et al.

(10) Patent No.: US 12,588,316 B2
(45) Date of Patent: *Mar. 24, 2026

(54) OPTOELECTRONIC DEVICE COMPRISING THREE-DIMENSIONAL SEMICONDUCTOR ELEMENTS AND METHOD FOR MANUFACTURING SAID DEVICE

(71) Applicant: Aledia, Echirolles (FR)

(72) Inventors: Olga Kryliouk, Fort Myers, FL (US); Jérôme Napierala, Saint Egrève (FR)

(73) Assignee: Aledia, Echirolles (FR)

( * ) Notice: Subject to any disclaimer, the term of this patent is extended or adjusted under 35 U.S.C. 154(b) by 752 days.

This patent is subject to a terminal disclaimer.

(21) Appl. No.: 17/621,676

(22) PCT Filed: Jun. 22, 2020

(86) PCT No.: PCT/EP2020/067298
§ 371 (c)(1),
(2) Date: Dec. 21, 2021

(87) PCT Pub. No.: WO2020/260181
PCT Pub. Date: Dec. 30, 2020

(65) Prior Publication Data
US 2022/0352415 A1       Nov. 3, 2022

(30) Foreign Application Priority Data

Jun. 25, 2019     (FR) ...................................... 1906901

(51) Int. Cl.
*H01L 21/20*          (2006.01)
*H10H 20/01*         (2025.01)
                (Continued)
(52) U.S. Cl.
CPC ........ *H10H 20/812* (2025.01); *H10H 20/013* (2025.01); *H10H 20/821* (2025.01); *H10H 20/825* (2025.01)

(58) Field of Classification Search
CPC ................ H01L 33/00–648; H01L 27/15–156
See application file for complete search history.

(56) References Cited

U.S. PATENT DOCUMENTS 11,411,137 B2 *   8/2022   Mughal ................ H10H 20/825
2005/0194598 A1   9/2005   Kim et al.
(Continued)

FOREIGN PATENT DOCUMENTS

EP         2 333 847 A1      6/2011
WO     WO-2010023921 A1 *   3/2010    ............. B82Y 20/00
(Continued)

OTHER PUBLICATIONS

International Search Report and Written Opinion for International Application No. PCT/EP2020/067298, mailed Apr. 22, 2021.
(Continued)

*Primary Examiner* — Eric A. Ward
(74) *Attorney, Agent, or Firm* — Wolf, Greenfield & Sacks, P.C.

(57)                ABSTRACT

A method for manufacturing an optoelectronic device including forming, by metal-organic chemical vapor deposition, MOCVD, wire-shaped, conical, or frustoconical semiconductor elements made of a III-V compound, doped or undoped, each semiconductor element extending along an axis and including a top, and forming by remote plasma chemical vapor deposition, RPCVD, or by molecular-beam epitaxy, MBE, or by hydride vapor phase epitaxy, HVPE, for each semiconductor element, an active area only on said top including at least a first semiconductor layer made of the III-V compound and a second semiconductor layer made of the III-V compound and an additional group-III element.

26 Claims, 5 Drawing Sheets

(51) Int. Cl.
  *H10H 20/812*      (2025.01)
  *H10H 20/821*      (2025.01)
  *H10H 20/825*      (2025.01)

(56)          References Cited

U.S. PATENT DOCUMENTS

| | | | | |
|---|---|---|---|---|
| 2007/0248132 A1* | 10/2007 | Kikuchi | ............... | H01L 33/007 |
| | | | | 438/150 |
| 2009/0020768 A1* | 1/2009 | Butcher | ............... | H01L 23/535 |
| | | | | 257/E33.001 |
| 2011/0169025 A1* | 7/2011 | Kishino | .......... | H01L 31/035227 |
| | | | | 257/E33.012 |
| 2011/0204327 A1* | 8/2011 | Hiruma | .................. | H01L 33/06 |
| | | | | 257/E33.048 |
| 2014/0027710 A1* | 1/2014 | Liu | .................... | H01L 21/0259 |
| | | | | 257/14 |
| 2014/0363912 A1* | 12/2014 | Ohlsson | ............. | H01L 33/0025 |
| | | | | 438/34 |
| 2016/0365480 A1* | 12/2016 | Mi | ...................... | H01S 5/32341 |
| 2017/0338369 A1* | 11/2017 | Wildeson | ............ | H10H 20/812 |
| 2018/0374988 A1* | 12/2018 | Mi | ...................... | H01L 33/0025 |
| 2020/0106244 A1* | 4/2020 | Noda | ................. | H01S 5/34333 |
| 2020/0279974 A1* | 9/2020 | Noda | .................... | H10D 8/053 |

FOREIGN PATENT DOCUMENTS

| | | |
|---|---|---|
| WO | WO 2017/009394 A1 | 1/2017 |
| WO | WO 2019/002786 A1 | 1/2019 |

OTHER PUBLICATIONS

Ra et al., Full-color single nanowire pixels for projection displays. Nano Letters. Jul. 13, 2016;16(7):4608-15.

* cited by examiner

OPTOELECTRONIC DEVICE COMPRISING THREE-DIMENSIONAL SEMICONDUCTOR ELEMENTS AND METHOD FOR MANUFACTURING SAID DEVICE

This application is a national stage filing under 35 U.S.C. § 371 of International Patent Application Serial No. PCT/EP2020/067298, filed Jun. 22, 2020, which claims priority to French patent application FR19/06901, filed Jun. 25, 2019. The contents of these applications are incorporated herein by reference in their entirety.

TECHNICAL FIELD

The present disclosure relates generally to optoelectronic devices comprising three-dimensional semiconductor elements, for example, microwires, nanowires, nanometer-sized or micrometer-sized conical elements, or nanometer-sized or micrometer-sized frustoconical elements, and to methods of manufacturing the same. Term "optoelectronic devices" is used to designate devices capable of converting an electric signal into an electromagnetic radiation or the other way, and especially devices dedicated to detecting, measuring, or emitting an electromagnetic radiation or devices dedicated to photovoltaic applications.

BACKGROUND ART

The improvement of axial-type optoelectronic devices comprising an active area formed at the top of each three-dimensional semiconductor element is here more particularly considered. The active area is the area having most of the electromagnetic radiation supplied by the optoelectronic device emitted therefrom or most of the electromagnetic radiation received by the optoelectronic device captured therein.

The three-dimensional semiconductor elements considered herein comprise a semiconductor material mainly comprising a group-III element and a group-V element (for example, gallium nitride GaN), called III-V compound hereafter. Such devices are for example described in U.S. Pat. No. 9,728,680.

A method of manufacturing an optoelectronic device comprising nanometer-range or micrometer-range semiconductor elements generally comprises growing semiconductor elements and growing an active area covering the top of each semiconductor element. The optoelectronic device may be formed in a reactor, for example by metal-organic chemical vapor deposition (MOCVD). The method generally comprises introducing into the reactor precursor gases of the III-V compound by proportions which favor the growth of each semiconductor element and each active area preferentially along an axis.

The forming of the active areas may comprise the introduction into the reactor of a precursor gas for an additional III compound, for example indium, the proportion of which controls the wavelength of the radiation emitted or absorbed by the active areas. Usually the higher the proportion of the additional III compound is, the higher the wavelength of the emitted/absorbed radiation is. However, it may be difficult to incorporate high proportion of the additional III compound so the emission or absorption of green or red light may be difficult to achieve.

Publication "Full-Color Single Nanowire Pixels for Projection Displays" by Yong-Ho Ra et al., published on Jun. 22, 2016 in NANO LETTERS, vol. 16, no. 7, pages 4608-4615 (XP055668994), discloses a manufacturing method of multicolor single InGaN/GaN dot-in-nanowire light emitting diodes. The nanowires are obtained by PA-MBE.

WO 2017/009394 discloses nanowires/nanopyramid shaped light emitting diodes and photodetectors. The GaN nanowires or nanopyramids are manufactured by SAG, MBE or MOCVD.

EP 2 333 847 discloses a semiconductor optical element array and manufacturing method. The nanowires are obtained by MBE.

US 2005/194598 discloses a super bright light emitting diode of nanorod array structure having InGaN quantum well and method for manufacturing the same. The quantum well is manufactured by MO-HVPE.

SUMMARY OF INVENTION

Thus, an object of an embodiment is to at least partly overcome the disadvantages of the previously-described optoelectronic devices comprising micrometer- or nanometer-range semiconductor elements, particularly semiconductor microwires or nanowires, and of the methods of manufacturing the same.

Another object of an embodiment is to be able to control with precision the shapes of the semiconductor layers of the active areas resting on the micrometer- or nanometer-range semiconductor elements.

Another object of an embodiment is, for any wavelength in at least the visible spectrum, to be able to form an active area on a micrometer- or nanometer-range semiconductor element emitting or absorbing radiation at that wavelength.

Another object of an embodiment is to be able to manufacture the optoelectronic devices comprising nanometer- or micrometer-range semiconductor elements at an industrial scale and at a low cost.

One embodiment provides a method for manufacturing an optoelectronic device comprising forming, by metal-organic chemical vapor deposition, MOCVD, wire-shaped, conical, or frustoconical semiconductor elements made of a III-V compound, doped or undoped, each semiconductor element extending along an axis and comprising a top, and forming by remote plasma chemical vapor deposition, RPCVD, or by molecular-beam epitaxy, MBE, or by hydride vapor phase epitaxy, HVPE, for each semiconductor element, an active area only on said top comprising at least a first semiconductor layer made of the III-V compound and a second semiconductor layer made of the III-V compound and an additional group-III element.

According to an embodiment, each active area comprises at least one quantum well formed on a quantum barrier), and the growth conditions of the quantum barrier are selected to promote the formation of an upper surface of the quantum barrier having a c-plane with a desired mean diameter.

According to an embodiment, the method further comprises forming, among said wire-shaped, conical, or frustoconical semiconductor elements, first wire-shaped, conical, or frustoconical semiconductor elements having a first mean diameter and second wire-shaped, conical, or frustoconical semiconductor elements having a second mean diameter superior to the first diameter, the active areas on top of the first semiconductor elements emitting a first radiation at a first wavelength and the active areas on top of the second semiconductor elements emitting a second radiation at a second wavelength different from the first wavelength.

According to an embodiment, the MOCVD step is performed at a temperature in the range from 900° C. to 1065° C. and the step forming the active areas is performed at a temperature in the range from 570° C. to 800° C.

According to an embodiment, a precursor gas of the group-V element and a precursor gas of the group-III element are injected into the first reactor during the MOCVD step and the ratio of the flow of precursor gas of the group-V element to the flow of precursor gas of the group-III element, called V/III ratio, being in the range from 5 to 1000.

According to an embodiment, the MOCVD step is performed at a pressure in the range from 6.7 kPa to 26.7 kPa.

According to an embodiment, the step for forming the active areas is an RPCVD step performed at a pressure in the range from 400 Pa to 1333 Pa.

According to an embodiment, the step for forming the active areas is an MBE step performed at a pressure in the range from $4*10^{-3}$ mPa to $8*10^{-6}$ mPa.

According to an embodiment, the method further comprises, before the formation of the active areas, the formation by RPCVD, MBE, or HVPE, for each semiconductor element, of a first semiconductor layer on said top made of the III-V compound.

According to an embodiment, the MBE step for forming the first semiconductor layers is performed at a temperature in the range from 800° C. to 900° C.

According to an embodiment, the method further comprises, after the formation of the active areas, the formation by RPCVD, MBE, or HVPE, for each semiconductor element, of a second semiconductor layer on said active area made of the III-V compound.

According to an embodiment, the method further comprises, after the formation of the active areas and before the formation of the second semiconductor layers, the formation by RPCVD, MBE, or HVPE, for each semiconductor element, of an electron blocking layer of said active area.

According to an embodiment, the active areas are the areas having most the radiation supplied by the optoelectronic device emitted therefrom or having most the radiation received by the optoelectronic device captured therein.

According to an embodiment, the III-V compound is a III-N compound, particularly selected from the group comprising gallium nitride, aluminum nitride, indium nitride, gallium indium nitride, gallium aluminum nitride, aluminum indium nitride, and gallium aluminum indium nitride.

One embodiment also provides an optoelectronic device made by the manufacturing method previously disclosed.

According to an embodiment, the semiconductor elements comprise at least first and second semiconductor elements, the active areas comprising first active areas resting on the tops of the first semiconductor elements and configured to emit or to receive a first electromagnetic radiation at a first wavelength and second active areas resting on the tops of the second semiconductor elements and configured to emit or to receive a second electromagnetic radiation at a second wavelength different from the first wavelength.

According to an embodiment, the diameter of each first semiconductor element is smaller than the diameter of each second semiconductor element, the first and second active areas comprising a single quantum well or multiple quantum wells and the first wavelength being greater than the second wavelength.

BRIEF DESCRIPTION OF DRAWINGS

The foregoing features and advantages, as well as others, will be described in detail in the following description of specific embodiments given by way of illustration and not limitation with reference to the accompanying drawings, in which.

DESCRIPTION OF EMBODIMENTS

Figure 1:
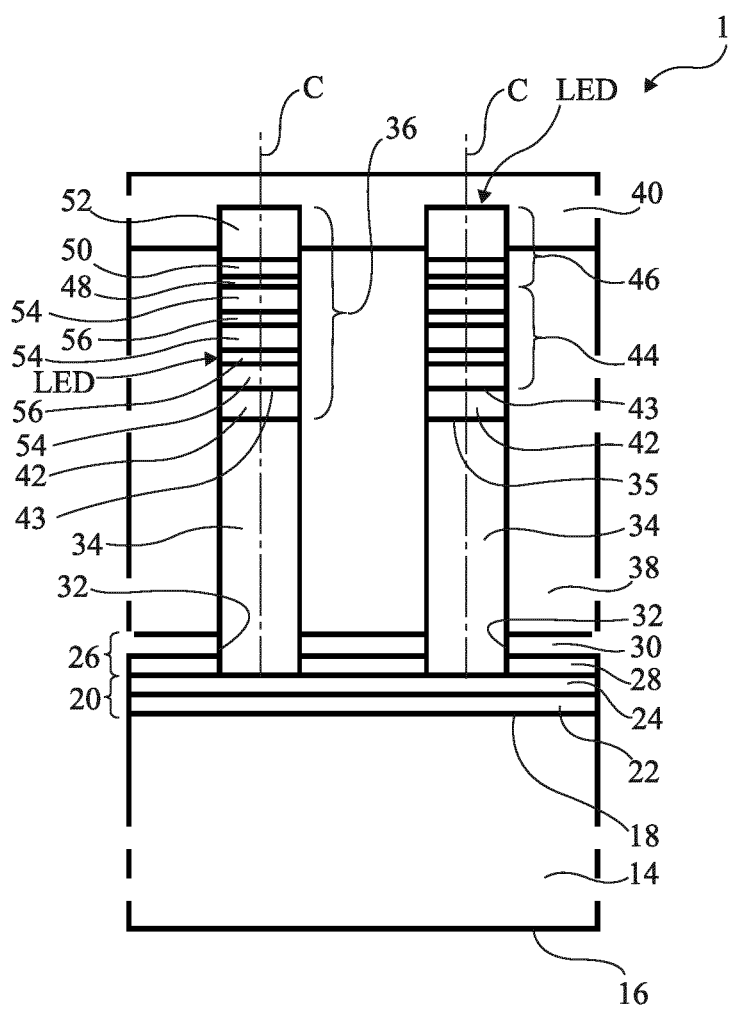
FIG. 1 is a partial simplified cross-section view of an embodiment of an optoelectronic device comprising microwires or nanowires.

Like features have been designated by like references in the various figures. In particular, the structural and/or functional features that are common among the various embodiments may have the same references and may dispose identical structural, dimensional and material properties. Further, as usual in the representation of electronic circuits, the various drawings are not to scale. Further, only those elements which are useful to the understanding of the present description have been shown and will be described. In particular, the means for biasing the optoelectronic device are well known and will not be described.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures, or to an optoelectronic device as orientated during normal use. Unless specified otherwise, the expressions "around", "approximately", "substantially" and "in the order of" signify within 10%, and preferably within 5%. Moreover, unless specified otherwise, the expression "insulating" means "electrically insulating" and the expression "conductive" means "electrically conductive".

The present application particularly relates to optoelectronic devices comprising three-dimensional elements, for example, microwires, nanowires, nanometer-sized or micrometer-sized conical elements, or nanometer-sized or micrometer-sized frustoconical elements. In particular, a conical or frustoconical element may be a circular conical or frustoconical element or a pyramidal conical or frustoconical element. In the following description, embodiments are particularly described for optoelectronic devices comprising microwires or nanowires. However, such embodiments may be implemented for three-dimensional elements other than microwires or nanowires, for example, conical or frustoconical three-dimensional elements.

Terms "microwire", "nanowire", "conical element", or "frustoconical element" designate a three-dimensional structure having a shape elongated along a preferred direction, having at least two dimensions, called minor dimensions, in the range from 5 nm to 2.5 μm, preferably from 50 nm to 1 μm, most preferably from 30 nm to 300 nm, the third dimension, called major dimension, being greater than or equal to 1 time, preferably greater than or equal to 5 times, the largest minor dimension, for example in the range from 1 μm to 5 μm.

In the following description, term "wire" is used to mean "microwire" or "nanowire". Preferably, the median line of the wire which runs through the centers of gravity of the cross-sections, in planes perpendicular to the preferred direction of the wire, is substantially rectilinear and is called "axis" of the wire hereafter. The wire diameter is here defined as being a quantity associated with the perimeter of the wire at the level of a cross-section. It may be the diameter of a disk having the same surface area as the wire cross-section. The local diameter, also called diameter hereafter, is the wire diameter at a given height thereof along the wire axis. The mean diameter is the mean, for example, arithmetic, of the local diameters along the wire or a portion thereof.

In the following description, embodiments will be described in the case of an optoelectronic device comprising light-emitting diodes. It should however be clear that these embodiments may concern other applications, particularly devices dedicated to electromagnetic radiation detection or measurement or devices dedicated to photovoltaic applications.

According to an embodiment, each axial-type light-emitting diode comprises a wire, as previously disclosed, and an active area on top of the wire. According to an embodiment, the wires are formed by metal-organic chemical vapor deposition (MOCVD) and at least the active areas are formed by remote plasma chemical vapor deposition (RPCVD), or by molecular-beam epitaxy (MBE), or by hydride vapor phase epitaxy (HVPE).

The formation of the wires by MOCVD advantageously allows wires with less defects, in particular with no defects, to be obtained compared to what can be obtained with RPCVD, MBE or HVPE methods. The formation of the wires by MOCVD advantageously allows a fast growth of the wires to be obtained. The active area can comprise a quantum well or quantum wells made of a ternary compound that comprises the elements of groups III and V of the wire and a supplementary group-III element. The length of the radiation emitted by the active area depends on the incorporated proportion of supplementary group-III element. For example, the wires can be made of GaN and the quantum well or quantum wells can be made of InGaN. The length of the radiation emitted by the active area hence depends on the incorporated proportion of In. The RPCVD, MBE or HVPE methods allow advantageously higher proportion of the supplementary group-III element to be incorporated in the quantum wells than what MOCVD method does.

Moreover, the fact that the active area is formed only on top of the wire, and not on the lateral sides of the wire, allows advantageously the active area to be formed only on c-plane or semipolar-planes and not on m-planes. This allows advantageously higher proportion of the supplementary group-III element to be incorporated in the quantum wells than when the active area is grown on m-planes.

Active area is the area having most of the radiation delivered by light-emitting diode emitted therefrom. Active area may comprise confinement means. Active area may comprise one quantum well, two quantum wells or several quantum wells, each quantum well being interposed between two barrier layers, the quantum well having a bandgap energy smaller than that of the barrier layers. The formation of the active area by RPCVD, MBE or HVPE allows advantageously to shape precisely the surface on which each quantum well is formed. In an embodiment, the growth conditions of a barrier layer can be selected so that the upper surface of the barrier layer, on which the quantum well is formed, comprises pure c-plane orientation. In an embodiment, the growth conditions of a semiconductor barrier layer can be selected so that the upper surface of the barrier layer, on which the quantum well is formed, comprises pure semipolar planes. In an embodiment, the growth conditions of a barrier layer can be selected so that the upper surface of the barrier layer, on which the active area is formed, comprises a combination of polar/semipolar planes to command the diameter of the c-plane on top of the barrier layer. The wavelength of the radiation emitted by the quantum well can depend on the crystalline planes on which the quantum well is grown. This is the case for example when the active area comprises a quantum well or quantum wells made of a ternary compound that comprises the elements of groups III and V of the wire and a supplementary group-III element. The length of the radiation emitted by the active area depends on the incorporated proportion of the group-III element that depends on the crystalline planes of the surface on which the quantum well is grown. Therefore, controlling with precision the upper surface of the barrier layer allows a precise control of the wavelength emitted by the quantum well grown on the barrier layer to be obtained.

Moreover, a semiconductor cap of the same III-V compound than the wire can advantageously be formed on top of the wire by RPCVD, MBE or HVPE before the formation of the active area. This allows advantageously to reshape the surface on which the active area is formed.

The previously disclosed method can be implemented to manufacture an optoelectronic device capable of displaying images, particularly a display screen or an image projection device. In particular, the previously disclosed method can be implemented to manufacture wires of different mean diameters, for example first wires with a small mean diameter, second wires with an intermediate diameter and third wires with a big diameter. The active areas formed on a first, second and third wires will emit radiations at different wavelengths. A color display screen can then be manufactured. Moreover, with the previously disclosed method, wires having tops with only a c-plane and no semipolar planes can be formed. In that case, the active areas formed on a first, second and third wires will emit radiations at decreasing wavelengths respectively, for example red, green and blue lights respectively.

FIG. 1 is a partial simplified cross-section view of an optoelectronic device 10 formed from wires such as previously described and capable of emitting an electromagnetic radiation.

Optoelectronic device 10 comprises, from bottom to top in FIG. 1:

a substrate 14, for example, semiconductor, comprising parallel opposed surfaces 16 and 18, preferably planar, surface 18 being treated to promote the growth of wires in organized fashion. This treatment is schematically shown in FIG. 1 by a stack 20 of seed layers on surface 18 of substrate 14, two seed layers 22, 24 being shown as an example in FIG. 1;

a stack 26 of insulating layers, two insulating layers 28, 30 being shown as an example in FIG. 1, covering seed layer 24 and comprising through openings 32;

wires 34 having an axis C, two wires 34 being shown in FIG. 1;

for each wire 34, a head 36 covering the top 35 of wire 34;

insulating layer 38 covering the lateral faces of wires 34, and partly the lateral faces of heads 36; and an electrode layer 40 covering insulating layer 38 and in contact with heads 36.

The optoelectronic device 10 comprises another electrode, not shown, for biasing the basis of the wires 34.

Each head 36 comprises from bottom to top in FIG. 1:

a semiconductor layer 42, also called semiconductor cap, of the same material as wire 34 and doped with a first conductivity type, for example, type N, covering top 35 of wire 34 an having an upper face 43;

an active area 44 covering face 43 of semiconductor layer 42; and for each wire 34, a semiconductor stack 46 covering the active area 44 and comprising a semiconductor layer 50, having a conductivity type opposite to that of wire 34, covering active area 44.

The assembly formed by each wire 34 and the associated head 36 forms a light-emitting diode LED in axial configuration. Active area 44 is the area having most of the electromagnetic radiation delivered by light-emitting diode LED emitted therefrom. Several light-emitting diodes LED may be connected in parallel and form an assembly of light-emitting diodes. The assembly may comprise from a few light-emitting diodes LED to some thousand light-emitting diodes.

Stack 46 may further comprise a electron blocking layer 48 between active area 44 and semiconductor layer 50 and a bonding layer 52 covering semiconductor layer 50 on the side opposite to active area 44, bonding layer 52 being covered with electrode 40. Bonding layer 52 can be made of the same material as semiconductor layer 50, with the same conductivity type as semiconductor layer 50 but with a higher concentration of dopants. Bonding layer 52 enables to form an ohmic contact between semiconductor layer 50 and electrode 40.

Each wire 34, each semiconductor layers 42, 50, 52, and each layer of active area 44 is at least partly formed from at least one semiconductor material. According to an embodiment, the semiconductor material is a III-V compound, for example, a III-N compound. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions. The semiconductor material of wires 34 and semiconductor layers 42, 50, 52 may comprise a dopant, for example, silicon providing an N-type doping of a III-N compound, or magnesium providing a P-type doping of a III-N compound.

Each wire 34 may have an elongated semiconductor structure along an axis C substantially perpendicular to surface 18. Each wire 34 may have a generally cylindrical shape. The axes of two adjacent wires 34 may be distant by from 100 nm to 3 μm and preferably from 200 nm to 1.5 μm. The height of each wire 34 may be in the range from 150 nm to 10 μm, preferably from 200 nm to 1 μm, more preferably from 250 nm to 750 nm. The mean diameter of each wire 34 may be in the range from 50 nm to 10 μm, preferably from 100 nm to 2 μm, more preferably from 120 nm to 1 μm. The cross-section of wires 34 may have different shapes, such as, for example, an oval, circular, or polygonal, particularly triangular, rectangular, square, or hexagonal, shape.

Active area 44 is the area having most of the radiation delivered by light-emitting diode LED emitted therefrom. According to an example, active area 44 may comprise confinement means. Active area 44 may comprise at least one quantum well, comprising a layer of an additional semiconductor material having a bandgap energy smaller than that of semiconductor layer 42 and of semiconductor layer 50, preferably interposed between two barrier layers, thus improving the charge carrier confinement. The additional semiconductor material may comprise the III-V compound of doped semiconductor layers 42, 50 having at least one additional element incorporated therein. As an example, in the case of wires 34 made up of GaN, the additional material forming the quantum well is preferably InGaN. The atomic percentage of the additional element is a function of the desired optical properties and of the emission spectrum of the light-emitting diode LED. Active area 44 may be formed of a single quantum well or of a plurality of quantum wells.

According to a preferred embodiment, each wire 34 is made up of GaN, the quantum well(s) of active area 44 being made of InGaN. The emission wavelength of active area 44 particularly depends on the proportion of indium in the quantum well(s). Semiconductor layer 42 may be made of GaN and be doped with the first conductivity type, for example, type N, particularly with silicon. The height of semiconductor layer 42, measured along axis C, may be in the range from 10 nm to 1 μm, for example, in the range from 20 nm to 200 nm. Active area 44 may comprise one or a plurality of quantum wells, for example, made of InGaN. Active area 44 may comprise a single quantum well which continuously extends along axis C between semiconductor layers 42, 50. As a variation, it may comprise multiple quantum wells and is then formed of an alternation, along axis C, of quantum wells 56 for example made of InGaN, and of barrier layers 54 for example made of GaN, three GaN layer 54 and two InGaN layers 56 being shown as an example in FIG. 1. GaN layers 54 may be doped, for example, of type N or P, or non-doped. The thickness of active area 44, measured along axis C, may be in the range from 2 nm to 100 nm. Semiconductor layer 50 may be made of GaN and be doped with the second conductivity type opposite to the first type, for example, type P, particularly with magnesium. The thickness of semiconductor layer 50 may be in the range from 20 nm to 100 nm. When an electron blocking layer 48 is present, it may be made of a ternary III-N compound, for example, AlGaN or AlInN, advantageously P-type doped. It enables to increase the radiative recombination rate within active area 44. The thickness of electron blocking layer 48 may be in the range from 10 nm to 50 nm. The electron blocking layer 48 may correspond to a superlattice of layers of InAlGaN and GaN, each layer having a thickness for example of 2 nm.

When wires 34 have a polarity of the III-group element type, top 35 of each wire 34 can comprise only semipolar planes. When wires 34 have a polarity of the V-group element type, top 35 of each wire 34 can comprise only a c-plane. However, treatments can be provided after the growth of wires 34 so that, even when wires 34 have a polarity of the III-group element type, top 35 of each wire 34 has only a c-plane or a combination of a c-plane and semipolar planes. The upper surface 43 of semiconductor layer 42 corresponds substantially only to a c-plane. The layers 54, 56 of the active area 44 can comprise substantially only c-planes, both polar and semipolar planes, or only semipolar planes.

The light-emitting diode is said to be in an axial configuration since active area 44 essentially coats a surface of semiconductor layer 42 substantially orthogonal to axis C and extends along axis C. Further, semiconductor stack 46 essentially coats an upper surface of active area 44 and extends along axis C.

Three-dimensional light-emitting diodes in an axial configuration have an emission surface area smaller than that of light-emitting diodes in a radial configuration, but have the advantage of being made of a semiconductor material of better crystalline quality, thus providing a higher internal quantum efficiency, particularly due to a better relaxation of the stress at the interfaces between semiconductor layers. In the case of quantum wells made of InGaN, three-dimensional light-emitting diodes in an axial configuration thus enable to incorporate more indium to emit, for example, in red or green.

Substrate 14 may correspond to a monoblock structure or correspond to a layer covering a support made of another material. Substrate 14 is preferably a semiconductor substrate, for example, a substrate made of silicon, of germanium, of silicon carbide, of a III-V compound, such as GaN or GaAs, or a ZnO substrate, or a conductive substrate, for example, a substrate made of a metal or a metal alloy, particularly copper, titanium, molybdenum, a nickel-based alloy, and steel. Preferably, substrate 14 is a single-crystal silicon substrate. Preferably, it is a semiconductor substrate compatible with manufacturing methods implemented in microelectronics. Substrate 14 may correspond to a multilayer structure of silicon-on-insulator type, also called SOI. Substrate 14 may be heavily doped, lightly-doped, or non-doped.

Seed layers 22, 24 are made of a material which favors the growth of wires 34. The material forming each seed layer 22, 24 may be a metal, a metal oxide, a nitride, a carbide, or a boride of a transition metal of column IV, V, or VI of the periodic table of elements or a combination of these compounds and preferably a nitride of a transition metal of column IV, V, or VI of the periodic table of elements or a combination of these compounds. As an example, each seed layer 22, 24 may be made of aluminum nitride (AlN), of aluminum oxide ($Al_2O_3$), of boron (B), of boron nitride (BN), of titanium (Ti), of titanium nitride (TiN), of tantalum (Ta), of tantalum nitride (TaN), of hafnium (Hf), of hafnium nitride (HfN), of niobium (Nb), of niobium nitride (NbN), of zirconium (Zr), of zirconium borate ($ZrB_2$), of zirconium nitride (ZrN), of silicon carbide (SiC), of tantalum carbide nitride (TaCN), of magnesium nitride in $Mg_xN_y$ form, where x is approximately equal to 3 and y is approximately equal to 2, for example, magnesium nitride in $Mg_3N_2$ form. Each seed layer 22, 24 has, for example, a thickness in the range from 1 nm to 100 nm, preferably in the range from 10 nm to 30 nm.

Electrode layer 40 is a conductive layer capable of biasing the active areas of heads 36 and of giving way to the electromagnetic radiation emitted by the light-emitting diodes. The material forming conductive layer 40 may be a transparent conductive material such as graphene or a transparent conductive oxide (TCO), particularly indium tin oxide (ITO), zinc oxide doped or not with aluminum, or with gallium, or with boron. As an example, conductive layer 40 has a thickness in the range from 20 nm to 500 nm, preferably from 20 nm to 100 nm.

Each of insulating layers 28, 30, 38 is made of a material selected from the group comprising silicon oxide ($SiO_2$), silicon nitride ($Si_xN_y$, where x is approximately equal to 3 and y is approximately equal to 4, for example, $Si_3N_4$), silicon oxynitride (particularly of general formula $SiO_xN_y$, for example, $Si_2ON_2$), hafnium oxide ($HfO_2$), or aluminum oxide ($Al_2O_3$). According to an embodiment, insulating layer 28 is made of silicon oxide and insulating layer 30 is made of silicon nitride. The thickness of each insulating layer 28, 30 is in the range from 10 nm to 100 nm, preferably from 20 nm to 60 nm, particularly equal to approximately 40 nm. Insulating layer 38 may have a maximum thickness in the range from 100 nm to 5 μm.

FIGS. 2 to 7 are partial simplified cross-section views of the structures obtained at successive steps of an embodiment of a method for manufacturing optoelectronic device 10 shown in FIG. 1.

Figure 2:
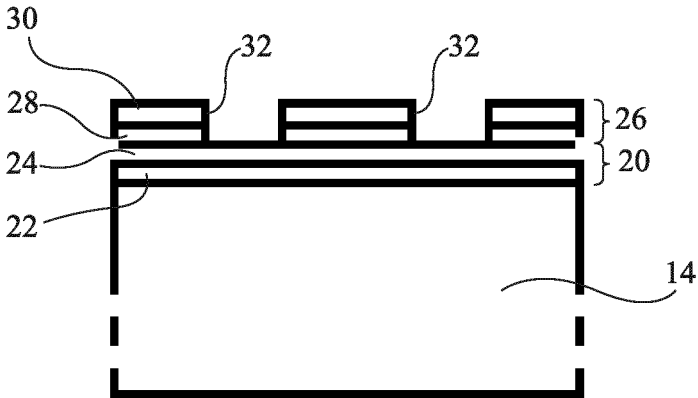
FIG. 2 illustrates a step of an embodiment of a method for manufacturing the optoelectronic device of FIG. 1.

FIG. 2 shows the structure obtained after the steps of:
forming on substrate 14 the stack 20 of seed layers 22, 24;
forming, on stack 20, stack 26 of insulating layers 28, 30; and
forming openings 32 in insulating layers 28 and 30 to expose portions of seed layer 24 at the desired locations of wires 34, the diameter of the openings 32 substantially corresponding to the diameter of the wires 34.

Each seed layer 22, 24 and each insulating layer 28, 30 may be deposited as an example by plasma-enhanced chemical vapor deposition (PECVD), low-pressure chemical vapor deposition (LPCVD), sub-atmospheric chemical vapor deposition (SACVD), CVD, physical vapor deposition (PVD), or atomic layer deposition (ALD).

Figure 3:
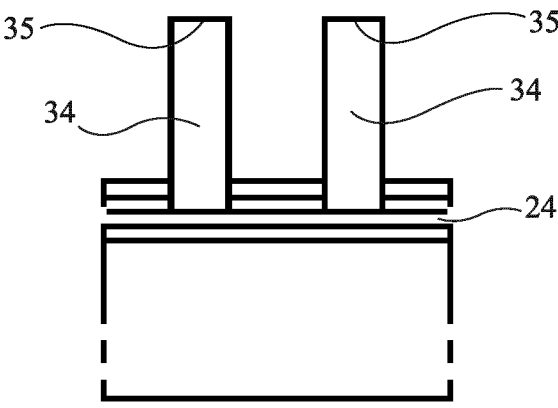
FIG. 3 illustrates another step of the manufacturing method.

FIG. 3 shows the structure obtained after the step of simultaneously growing wires 34 from seed layer 24 in openings 32. According to an embodiment, the method of growing wires 34 is metal-organic chemical vapor deposition (MOCVD), also known as metal-organic vapor phase epitaxy (MOVPE). The growth conditions in the reactor are adapted to promote the preferential growth of each wire 34 along its axis C. This means that the growth speed of wire 34 along axis C is much larger, preferably by at least one order of magnitude, than the growth speed of wire 34 along a direction perpendicular to axis C. As an example, the method may comprise injecting into a reactor a precursor of a group-III element and a precursor of a group-V element. Examples of precursors of group-III elements are trimethylgallium (TMGa), triethylgallium (TEGa), trimethylindium (TMIn), or trimethylaluminum (TMAl). Examples of precursors of group-V elements are ammonia ($NH_3$), tertiary-butylphosphine (TBP), arsine ($AsH_3$), or dimethylhydrazine (UDMH). Some of the precursor gases may be generated by using a bubbler and a carrier gas.

According to an embodiment, the temperature in the reactor is in the range from 900° C. to 1065° C., preferably in the range from 1000° C. to 1065° C., in particular 1050° C. According to an embodiment, the pressure in the reactor is in the range from 50 Torr (approximately 6.7 kPa) to 200 Torr (approximately 26.7 kPa), in particular 100 Torr (approximately 13.3 kPa). According to an embodiment, the flow of the precursor of the group-III element, for example TEGa, is in the range from 500 sccm to 2500 sccm, in particular 1155 sccm. According to an embodiment, the flow of the precursor of the group-V element, for example NH₃, is in the range from 65 sccm to 260 sccm, in particular 130 sccm. According to an embodiment, the ratio of the flow of the precursor gas of the group-V element injected in the reactor to the flow of the precursor gas of the group-III element injected in the reactor, called V/III ratio, is in the range from 5 to 15. Carrier gases may include $N_2$ and $H_2$. According to an embodiment, the percentage of hydrogen injected into the reactor is in the range from 3% to 15% wth., in particular 5% wtk., to the total mass of the carrier gases. The obtained growth rate of the wire 34 may be in the range from 1 μm/h to 15 μm/h, in particular 5 μm/h.

A precursor for dopant may be injected in the reactor. For example, when the dopant is Si, the precursor may be silane (SiH₄). The flow of the precursor may be chosen to aim an average dopant concentration in the range from $5*10^{18}$ and $5*10^{19}$ atoms/cm³, in particular $10^{19}$ atoms/cm³.

After this step, when wires 34 have a polarity of the III-group element type, top 35 of each wire 34 can comprise only semipolar planes. When wires 34 have a polarity of the V-group element type, top 35 of each wire 34 can comprise only a c-plane. However, treatments can be provided after the growth of wires 34 so that, even when wires 34 have a polarity of the III-group element type, top 35 of each wire 34 has only a c-plane or a combination of a c-plane and semipolar planes.

Figure 4:
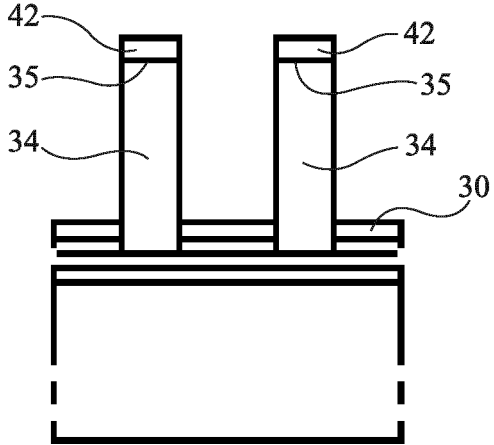
FIG. 4 illustrates another step of the manufacturing method.

FIG. 4 shows the structure obtained after the step of growing, for each wire 34, semiconductor layer 42 on top 35 of wire 34. According to an embodiment, semiconductor layers 42 are grown by remote plasma chemical vapor deposition (RPCVD). The MOCVD and RPCVD steps can be performed in different reactors or in the same reactor. The growth parameters are chosen so that the semiconductor layer 42 comprises an upper surface 43 corresponding only to a c-plane.

According to an embodiment, the temperature in the reactor is in the range from 600° C. to 750° C., in particular 710° C. According to an embodiment, the pressure in the reactor is in the range from 3 Torr (approximately 400 Pa) to 10 Torr (approximately 1333 Pa), preferably lower than 5 Torr (approximately 667 Pa), in particular 4.5 Torr (approximately 600 Pa). According to an embodiment, a plasma is created with a RF power of 5400 W. The flow of $H_2$ for the plasma may be equal to approximatively 2100 sccm. According to an embodiment, the flow of the precursor of the group-III element, for example TEGa, is in the range from 140 sccm to 200 sccm, in particular 160 sccm. According to an embodiment, the flow of the carrier gas, for example $H_2$, for the precursor of the group-III element is in the range from 3400 sccm to 3600 sccm, in particular 3500 sccm. According to an embodiment, the flow of the precursor of the group-V element, for example NH₃, is in the range from 100 sccm to 300 sccm, in particular 200 sccm. According to an embodiment, the flow of the carrier gas, for example $H_2$, for the precursor of the group-V element is in the range from 900 sccm to 1100 sccm, in particular 1000 sccm. The obtained growth rate of the wire 34 may be in the range from 0.1 nm/s to 0.15 nm/s, in particular 0.1 nm/s.

A precursor for dopant may be injected in the reactor. For example, when the dopant is Si, the precursor may be silane (SiH₄). The flow of the precursor may be chosen to aim an average dopant concentration in the range from $5*10^{18}$ and $2*10^{19}$ atoms/cm³, in particular $10^{19}$ atoms/cm³.

In another embodiment, semiconductor layers 42 are grown by MBE on each wire 34. According to an embodiment, for the growth by MBE of the intermediate layer, the temperature in the reactor is in the range from 800° C. to 900° C. According to an embodiment, the pressure in the reactor is in the range from $3*10^{-8}$ Torr (approximately $4*10^{-3}$ mPa) to $8*10^{-6}$ Torr (approximately 1 mPa). According to an embodiment, a plasma is created with a RF power of 360 W. According to an embodiment, the temperature of the solid source of the group-III element, for example Ga, is in the range from 900° C. to 1000° C., in particular 850° C. According to an embodiment, the flow of the gas precursor of the group-V element, for example $N_2$, is in the range from 0.75 sccm to 2.25 sccm, in particular 1.5 sccm.

Figure 5:
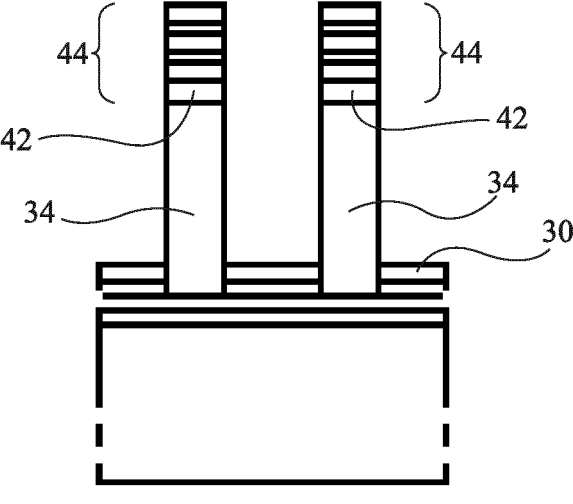
FIG. 5 illustrates another step of the manufacturing method.

FIG. 5 shows the structure obtained after the step of growing simultaneously the active area 44 for each wire 34. According to an embodiment, each layer of the active area 44 is grown by RPCVD. The forming of some layer of the active area 44 may comprise, in addition to the injection into the reactor of a precursor of a group-III element and of a precursor of a group-V element, a precursor of an additional element, particularly indium. The rate of incorporation of the additional element into active area 44 particularly depends on the lateral dimensions of the active areas 44, on the distance between wires 34, and on the height of the active areas 44 relative to the upper surface of dielectric layer 30.

The growth parameters can be chosen to favor a growth of the barrier layer 54 of the active area 44 with substantially only a c-plane orientation, as it is shown in FIG. 5. In that case, the growth parameters for each barrier layers 54 can be the same as the parameters disclosed for the growth of semiconductor layer 42.

The growth parameters can be chosen to favor a growth of the barrier layer 54 of the active area 44 with only semipolar planes. In that case, according to an embodiment, the temperature in the reactor is in the range from 700° C. to 800° C. According to an embodiment, the pressure in the reactor is in the range from 3 Torr (approximately 400 Pa) to 10 Torr (approximately 1333 Pa), preferably higher than 5 Torr (approximately 667 Pa), in particular 5.5 Torr (approximately 733 Pa). According to an embodiment, a plasma is created with a RF power of 5400 W. The flow of $H_2$ for the plasma may be equal to approximatively 2100 sccm. According to an embodiment, the flow of the precursor of the group-III element, for example TEGa, is in the range from 50 sccm to 80 sccm, in particular 70 sccm. According to an embodiment, the flow of a first carrier gas, for example $H_2$, for the precursor of the group-III element is in the range from 900 sccm to 1100 sccm, in particular 1000 sccm. According to an embodiment, the flow of a second carrier gas, for example $N_2$, for the precursor of the group-III element is in the range from 600 sccm to 800 sccm, in particular 700 sccm. According to an embodiment, the flow of the precursor of the group-V element, for example NH₃, is the range from 500 sccm to 700 sccm, in particular 600 sccm. According to an embodiment, the flow of a carrier gas, for example $N_2$, for the precursor of the group-V element is in the range from 400 sccm to 600 sccm, in particular 500 sccm.

The growth parameters can be chosen to favor a growth of the barrier layer 54 of the active area 44 with both semipolar and c-planes. The growth parameters are then between those disclosed previously for the growth with substantially only a c-plane orientation and those disclosed previously for the growth with only semipolar planes.

The growth parameters can be chosen to favor a growth of each well layer 56 of the active area 44 with only a c-plane orientation. In that case, according to an embodiment, the temperature in the reactor is in the range from 650° C. to 700° C. According to an embodiment, the pressure in the reactor is in the range from 3 Torr (approximately 400 Pa) to 10 Torr (approximately 1333 Pa), preferably higher than 5 Torr (approximately 667 Pa), in particular 5.5 Torr. According to an embodiment, a plasma is created with a RF power of 5400 W. The flow of $H_2$ for the plasma may be equal to approximatively 2100 sccm. According to an embodiment, the flow of the precursor of the group-III element, for example TEGa, is in the range from 20 sccm to 40 sccm, in particular 30 sccm. According to an embodiment, the flow of a carrier gas, for example $N_2$, for the precursor of the group-III element is in the range from 1500 sccm to 1800 sccm, in particular 1690 sccm. According to an embodiment, the flow of the precursor of the group-V element, for example $NH_3$, is the range from 500 sccm to 700 sccm, in particular 600 sccm. According to an embodiment, the flow of a carrier gas, for example $N_2$, for the precursor of the group-V element is in the range from 400 sccm to 600 sccm, in particular 500 sccm.

According to another embodiment, each layer of the active area 44 is grown by molecular-beam epitaxy (MBE). In an embodiment, the MOCVD and MBE steps are performed in different reactors. In an embodiment, the method may use for the MBE step a solid source/gas precursor for the group-III element and for the group-V element. According to an embodiment, a solid source can be used when group-III element is Ga and a precursor gas or plasma can be used when group-V element is N. According to an embodiment, an activated nitrogen beam is supplied by a DC plasma source. In this source, excited neutral nitrogen molecules are formed in an electric field-free region and accelerated toward the substrate by the pressure gradient with the vacuum chamber.

The forming of some layer of the active area 44, in particular quantum wells 56, may comprise the injection into the reactor of a solid/gas precursor of an additional element. According to an embodiment, a solid source can be used when additional group-III element is In. The rate of incorporation of the additional element into active area 44 particularly depends on the lateral dimensions of the active areas 44, on the distance between wires 34, on the height of the active areas 44 relative to the upper surface of dielectric layer 30.

A dopant may be injected in the reactor. For example, when the dopant is Si, a solid source may be used. According to an embodiment, the temperature of the solid source of the dopant element is in the range from 1000° C. to 1100° C.

According to an embodiment, for the growth by MBE of each barrier layer 54, the temperature in the reactor is in the range from 570° C. to 640° C., in particular 620° C. According to an embodiment, the pressure in the reactor is in the range from $3*10^{-8}$ Torr (approximately $4*10^{-3}$ mPa) to $8*10^{-6}$ Torr (approximately 1 mPa). According to an embodiment, a plasma is created with a RF power of 360 W. According to an embodiment, the temperature of the solid source of the group-III element, for example Ga, is in the range from 850° C. to 950° C., in particular 895° C. According to an embodiment, the flow of the gas precursor of the group-V element, for example $N_2$, is in the range from 0.75 sccm to 2.25 sccm, in particular 1.5 sccm.

According to an embodiment, for the growth by MBE of each well layer 56, the temperature in the reactor is in the range from 570° C. to 640° C., in particular 620° C.

According to an embodiment, the pressure in the reactor is in the range from $3*10^{-8}$ Torr (approximately $4*10^{-3}$ mPa) to $8*10^{-6}$ Torr (approximately 1 mPa). According to an embodiment, a plasma is created with a RF power of 360 W. According to an embodiment, the temperature of the solid source of the group-III element, for example Ga, is in the range from 850° C. to 950° C., in particular 895° C. According to an embodiment, the temperature of the solid source of the supplementary element, for example In, is in the range from 750° C. to 850° C., in particular 790° C. According to an embodiment, the flow of the gas precursor of the group-V element, for example $N_2$, is in the range from 0.75 sccm to 2.25 sccm, in particular 1.5 sccm.

Figure 6:
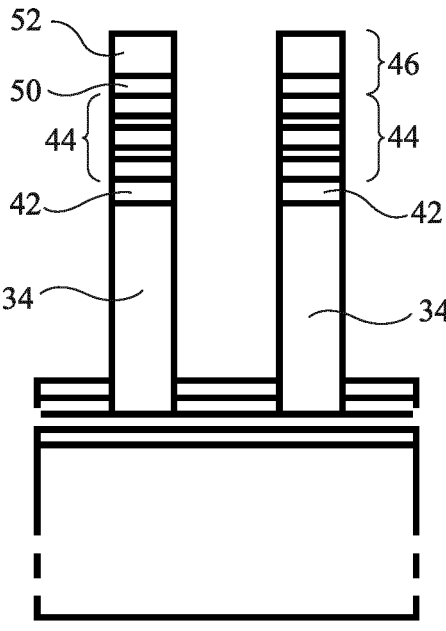
FIG. 6 illustrates another step of the manufacturing method.

FIG. 6 shows the structure obtained after the step of growing simultaneously the semiconductor stack 46 for each wire 34. According to an embodiment, each layer of the semiconductor stack 46 is grown by MBE. In particular, semiconductor layer 50 is grown with substantially only a c-plane orientation. According to an embodiment, for the growth by MBE of the electron blocking layer 48, the temperature in the reactor is in the range from 750° C. to 850° C., in particular 800° C. According to an embodiment, the pressure in the reactor is in the range $3*10^{-8}$ Torr (approximately $4*10^{-3}$ mPa) to $8*10^{-6}$ Torr (approximately 1 mPa). According to an embodiment, a plasma is created with a RF power of 360 W. According to an embodiment, the temperature of the solid source of the group-III element, for example Ga, is in the range from 850° C. to 950° C., in particular 905° C. According to an embodiment, the temperature of the solid source of the supplementary element, for example Al, is in the range from 1000° C. to 1100° C., in particular 1010° C. According to an embodiment, the flow of the gas precursor of the group-V element, for example $N_2$, is in the range from 0.75 sccm to 2.25 sccm, in particular 1.5 sccm. A dopant may be injected in the reactor. For example, when the dopant is Mg, a solid source may be used. According to an embodiment, the temperature of the solid source of the dopant element is in the range from 150° C. to 250° C., in particular 190° C.

According to an embodiment, each layer of the semiconductor stack 46 is grown by RPCVD.

Figure 7:
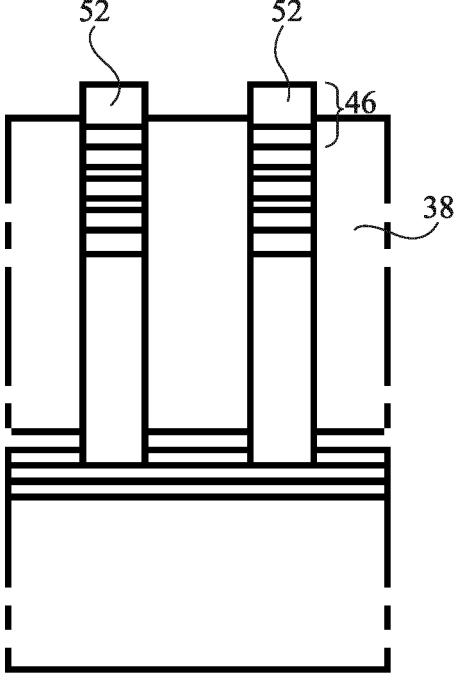
FIG. 7 illustrates another step of the manufacturing method.

FIG. 7 shows the structure obtained after the steps of forming insulating layer 38 and etching or thinning insulating layer 38 across part of its thickness to expose the tops of the heads 36. Insulating layer 38 may be formed by conformal deposition, for example, by LPCVD or PECVD. A partial etching of insulating layer 38 may be performed by chemical-mechanical planarization (CMP) and the rest of the etching may be performed by reactive ion etching (RIE). Heads 36 are not etched at this step.

The final steps of the embodiment of the manufacturing method comprise forming electrode layer 40, for example, by cathode sputtering, in contact with the exposed portions of heads 36 and on insulating layer 38.

Experiments were performed to illustrate the reshaping of the quantum barriers of the active area. First and second optoelectronic devices having the structure shown in FIG. 1 were manufactured according to the method previously disclosed in relation to FIGS. 2 to 7. For the first and second optoelectronic devices, active areas 44 comprised five InGaN layers 56, the first InGaN layer 56 being the InGaN layer closest to the wire 34. For the first and second optoelectronic devices, the manufacturing methods were identical except for the steps relative to the manufacturing of active areas 44. For the first and second optoelectronic devices, N doped GaN wire 34 was manufactured by MOCVD with the parameters indicated before. For the first and second optoelectronic devices, N doped GaN layer 32 was manufactured by RPCVD with the parameters indicated before.

Figure 8:
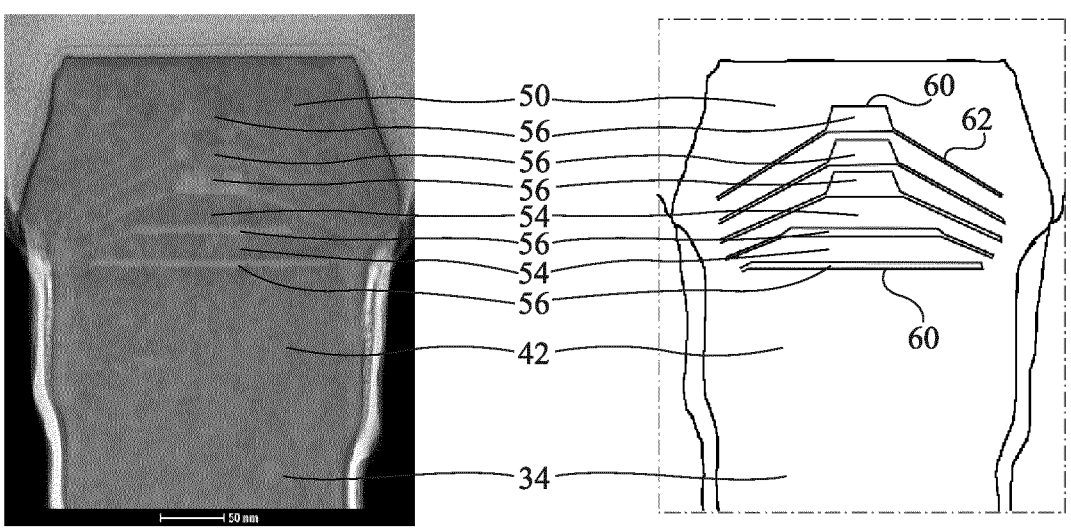
FIG. 8 shows, on the left-hand side, a cross-section image, obtained by transmission electron microscopy, of a part of a first light-emitting diode and, on the right-hand side, a simplified cross-section view showing the outlines of the regions of the TEM image on the left-hand side.

FIG. 8 shows, on the left-hand side, a cross-section image obtained by transmission electron microscopy of one head 36 and the associated wire 34 of the first optoelectronic device and, on the right-hand side, a simplified cross-section view showing the outlines of the regions of the cross-section image. For the first optoelectronic device, the GaN layers 54 and the InGaN layers 56 were manufactured with favoring the growth of c-planes and semipolar plane. Each InGaN layer 56 comprises a central part 60 grown on a c-plane, corresponding substantially to a cylinder, and a peripheral part 62 grown on a semipolar plane. The diameter of central part 60, the thickness of central part 60 and the concentration of Indium in InGaN layers 56 in central part 60 were measured. The results are given in Table 1 below:

TABLE 1

| InGaN layer (from wire 34) | Diameter of central part (nm) | Thickness of central part (nm) | Indium concentration (at %) |
|---|---|---|---|
| 1 | 180 | 4 | 15.5 |
| 2 | 125 | 6 | 17.5 |
| 3 | 50 | 14 | 27 |

In this experiment, the growth parameters that favor the growth with both polar plane and semi-polar planes are maintained throughout the growth of the active area 44. This results in the decrease of the diameter of the central c-plane portion of the InGaN 56 layers from semiconductor layer 52 to semiconductor layer 50.

Figure 9:
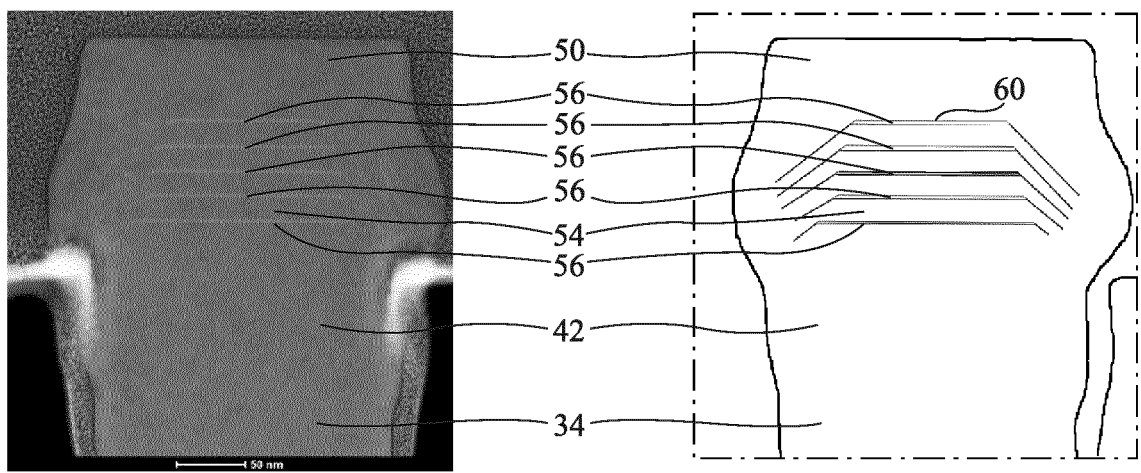
FIG. 9 shows, on the left-hand side, a TEM cross-section image of a part of a second light-emitting diode and, on the right-hand side, a simplified cross-section view showing the outlines of the regions of the TEM image on the left-hand side.

FIG. 9 shows, on the left-hand side, a cross-section image obtained by transmission electron microscopy of one head 36 and the associated wire 34 of the second optoelectronic device and, on the right-hand side, a simplified cross-section view showing the outlines of the regions of the cross-section image. For the first optoelectronic device, the GaN layers 54 and the InGaN layers 56 were manufactured with the growth parameters favoring the growth of only c-planes. Each InGaN layer 56 comprises the central part 60 grown on a c-plane, corresponding substantially to a cylinder, and substantially no peripheral part 62 grown on a semipolar plane. For each InGaN layer 56, the diameter of central part 60 was about 180 nm, the thickness of central part 60 was about 4 nm and the concentration of Indium in central part 60 was about 15.5 at %.

In the experiment illustrated in FIG. 8, quantum well layers 56 having c-planes and semipolar planes are manufactured. In the experiment illustrated in FIG. 9, quantum well layers 56 having mostly only c-planes are manufactured. The formation of the active area by RPCVD, MBE or HVPE allows advantageously to shape precisely the surface on which each quantum well is formed.

The previously disclosed optoelectronic device can be an optoelectronic device capable of displaying images, particularly a display screen or an image projection device.

A pixel of an image corresponds to the unit element of the image displayed or captured by the optoelectronic device. For the display of color images, the optoelectronic device generally comprises, for the display of each pixel of the image, at least three components, also called display sub-pixels, which each emit a light radiation substantially in a single color (for example, red, green, and blue). The superposition of the radiations emitted by the three display sub-pixels provides the observer with the colored sensation corresponding to the pixel of the displayed image. In this case, the assembly formed by the three display sub-pixels used to display a pixel of an image is called display pixel of the optoelectronic device.

Figure 10:
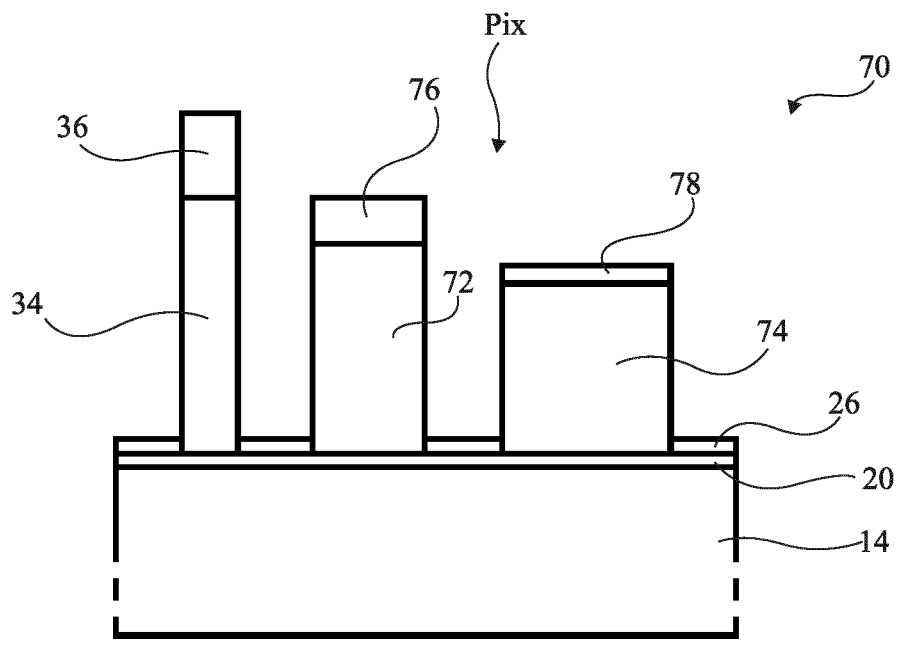
FIG. 10 is a partial simplified cross-section view of another embodiment of an optoelectronic device comprising microwires or nanowires of different diameters.
Figure 11:
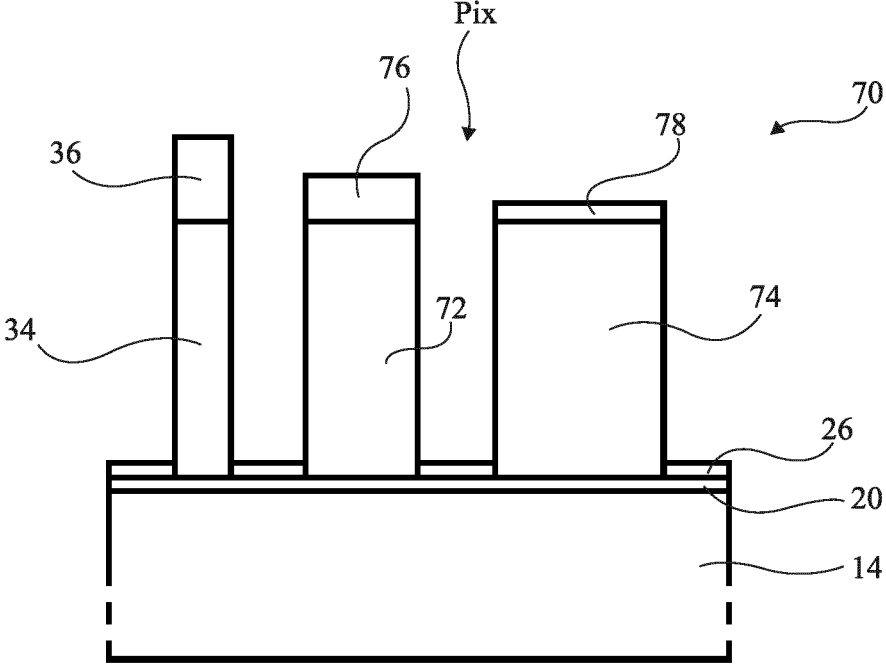
FIG. 11 is a partial simplified cross-section view of another embodiment of an optoelectronic device comprising microwires or nanowires of different diameters.

FIGS. 10 and 11 show cross-section views of embodiments of an optoelectronic device 70 for a display pixel Pix. The optoelectronic device 70 comprises the same elements as optoelectronic device 10 except that it further comprises, for each display pixel Pix, at least one wire 72 having a diameter bigger than the diameter of wire 34 and at least one wire 74 having a diameter bigger than the diameter of wire 72, a head 76 at an end of wire 72 and a head 78 at an end of wire 74. Heads 76, 78 have the same general structure as disclosed previously for head 36. Optoelectronic device 70 can comprise, for each display pixel Pix, three separate electrodes, not shown, in contact with the heads 36, 76, 78.

According to an embodiment, each display pixel Pix comprises at least two types of light-emitting diodes. According to an embodiment, the light-emitting diode of the first type, for example comprising wire 34 and head 36, is capable of emitting a first radiation at a first wavelength and the light-emitting diode of the second type, for example comprising wire 72 and head 76, is capable of emitting a second radiation at a second wavelength. According to an embodiment, each display pixel Pix comprises at least three types of light-emitting diodes, the light-emitting diode of the third type, for example comprising wire 74 and head 78 being capable of emitting a third radiation at a third wavelength. The first, second, and third wavelengths may be different. For each display pixel, the elementary light-emitting diodes having wires of same diameter can have a common electrode.

According to an embodiment, especially in the case where face 43 of semiconductor layer 42 corresponds to a crystallographic plane c only, the wavelength of the radiation emitted by active area 44 increases when the diameter of the wire 34, 72, 74, on which active area 44 rests, decreases. According to an embodiment, the third wavelength corresponds to blue light and is within the range from 430 nm to 490 nm. According to an embodiment, the second wavelength corresponds to green light and is within the range from 510 nm to 570 nm. According to an embodiment, the first wavelength corresponds to red light and is within the range from 600 nm to 720 nm. This is surprising insofar as it is generally disclosed that, when active area grows on semi-polar crystallographic planes, the wavelength of the radiation emitted by the active area increases when the diameter of the wire, on which the active area rests, increases.

According to an embodiment, each display pixel Pix comprises a light-emitting diode of a fourth type, the light-emitting diode of the fourth type being capable of emitting a fourth radiation at a fourth wavelength. The first, second, third, and fourth wavelengths may be different. According to an embodiment, the fourth wavelength corresponds to yellow light and is in the range from 570 nm to 600 nm.

In FIG. 10, wires 34, 72, 74 have different heights. This can be obtained by implementing the embodiment of the method for manufacturing the optoelectronic device previously disclosed in relation to FIGS. 2 to 7. Indeed, when the wires 34, 72, 74 are grown simultaneously, the final height of wires having a smaller diameter is bigger that the final height of wires having a bigger diameter.

In FIG. 11, wires 34, 72, 74 have the same height. This can be obtained by implementing the embodiment of the method for manufacturing the optoelectronic device, previously disclosed in relation to FIGS. 2 to 7 while adding after the step of simultaneous growth of the wires, previously disclosed in relation to FIG. 3, a step of etching the wires up to the same height before forming heads 36, 76, 78.

It should be noted that, in the described embodiments, two different growth methods at two stages of the manufacturing of the LED are used. Such a switch between two growth methods is not present in existing manufacturing methods. Using two different growth methods can appear at detrimental in the efficiency of the method. Indeed, switching from MOCVD to MBE, RPCVD or HVPE in the middle of a growing phase looks complicated since MBE, RPCVD or HVPE are low pressure methods with respect to MOCVD. Also, the need to change the reactor between the growth methods looks detrimental to the efficiency. The unsuspected advantages of the use of two different growth methods on the rapidity of the method and quality of product justify however such a switching.

Various embodiments and variants have been described. Those skilled in the art will understand that certain features of these embodiments can be combined and other variants will readily occur to those skilled in the art. In particular, three-dimensional semiconductor structures capable of emitting a light radiation from an electric signal, thus forming light-emitting diodes, have been described. As a variation, the structures may be capable of detecting an incident light radiation and of generating as a response an electric signal, thus forming a photodiode. The applications may concern the optoelectronics or photovoltaics field.

Finally, the practical implementation of the embodiments and variants described herein is within the capabilities of those skilled in the art based on the functional description provided hereinabove.

The invention claimed is:

1. A method for manufacturing an optoelectronic device comprising:

forming in a first reactor, by metal-organic chemical vapor deposition, MOCVD, wire-shaped, conical, or frustoconical semiconductor elements made of a III-V compound, doped or undoped, each semiconductor element extending along an axis and comprising a top; and forming in a second reactor, different from the first reactor, by molecular-beam epitaxy, MBE, at a pressure in the range from $4*10^{-3}$ mPa to 1 mPa, for each semiconductor element, an active area only on said top comprising at least a first semiconductor layer made of the III-V compound and a second semiconductor layer made of the III-V compound and an additional group-III element.

2. The method of claim 1, wherein each active area comprises at least one quantum well formed on a quantum barrier, and wherein the growth conditions of the quantum barrier are selected to promote the formation of an upper surface of the quantum barrier having a c-plane with a desired mean diameter.

3. The method of claim 1, comprising forming, among said wire-shaped, conical, or frustoconical semiconductor elements, first wire-shaped, conical, or frustoconical semiconductor elements having a first mean diameter and second wire-shaped, conical, or frustoconical semiconductor elements having a second mean diameter superior to the first mean diameter, the active areas on top of the first semiconductor elements emitting a first radiation at a first wavelength and the active areas on top of the second semiconductor elements emitting a second radiation at a second wavelength different from the first wavelength.

4. The method of claim 1, wherein the MOCVD step is performed at a temperature in the range from 900° C. to 1065° C. and the step for forming the active areas is performed at a temperature in the range from 570° C. to 800° C.

5. The method of claim 1, wherein a precursor gas of the group-V element and a precursor gas of the group-III element are injected into the first reactor during the MOCVD step and wherein the ratio of the flow of precursor gas of the group-V element to the flow of precursor gas of the group-III element, called V/III ratio, being in the range from 5 to 1000.

6. The method of claim 1, wherein the MOCVD step is performed at a pressure in the range from 6.7 kPa to 26.7 kPa.

7. The method of claim 1, comprising, before the formation of the active areas, the formation by MBE, for each semiconductor element, of a first semiconductor layer on said top made of the III-V compound.

8. The method of claim 7, wherein the MBE step for forming the first semiconductor layers is performed at a temperature in the range from 800° C. to 900° C.

9. The method of claim 1, comprising, after the formation of the active areas, the formation by MBE, for each semiconductor element, of a second semiconductor layer on said active area made of the III-V compound.

10. The method of claim 9, comprising, after the formation of the active areas and before the formation of the second semiconductor layers, the formation by MBE, for each semiconductor element, of an electron blocking layer of said active area.

11. The method of claim 1, wherein the active areas are the areas having most the radiation supplied by the optoelectronic device emitted therefrom or having most the radiation received by the optoelectronic device captured therein.

12. The method of claim 1, wherein the III-V compound is a III-N compound, particularly selected from the group comprising gallium nitride, aluminum nitride, indium nitride, gallium indium nitride, gallium aluminum nitride, aluminum indium nitride, and gallium aluminum indium nitride.

13. The method of claim 1, wherein the semiconductor elements comprise at least first and second semiconductor elements, wherein the active areas comprise first active areas resting on the tops of the first semiconductor elements and configured to emit or to receive a first electromagnetic radiation at a first wavelength and second active areas resting on the tops of the second semiconductor elements and configured to emit or to receive a second electromagnetic radiation at a second wavelength different from the first wavelength.

14. The method of claim 1, wherein the diameter of each first semiconductor element is smaller than the diameter of each second semiconductor element, wherein the first and second active areas comprise a single quantum well or multiple quantum wells and wherein the first wavelength is greater than the second wavelength.

15. A method for manufacturing an optoelectronic device comprising:

forming in a first reactor, by metal-organic chemical vapor deposition, MOCVD, wire-shaped, conical, or frustoconical semiconductor elements made of a III-V compound, doped or undoped, each semiconductor element extending along an axis and comprising a top; and forming in a second reactor, different from the first reactor, by remote plasma chemical vapor deposition, RPCVD, at a pressure in the range from 400 Pa to 1333 Pa, for each semiconductor element, an active area only on said top comprising at least a first semiconductor layer made of the III-V compound and a second semiconductor layer made of the III-V compound and an additional group-III element, wherein the MOCVD step is performed at a temperature in the range from 900° C. to 1065° C. and the step for forming the active areas is performed at a temperature in the range from 570° C. to 800° C.

16. The method of claim 15, wherein each active area comprises at least one quantum well formed on a quantum barrier, and wherein the growth conditions of the quantum barrier are selected to promote the formation of an upper surface of the quantum barrier having a c-plane with a desired mean diameter.

17. The method of claim 15, comprising forming, among said wire-shaped, conical, or frustoconical semiconductor elements, first wire-shaped, conical, or frustoconical semiconductor elements having a first mean diameter and second wire-shaped, conical, or frustoconical semiconductor elements having a second mean diameter superior to the first mean diameter, the active areas on top of the first semiconductor elements emitting a first radiation at a first wavelength and the active areas on top of the second semiconductor elements emitting a second radiation at a second wavelength different from the first wavelength.

18. The method of claim 15, wherein a precursor gas of the group-V element and a precursor gas of the group-III element are injected into the first reactor during the MOCVD step and wherein the ratio of the flow of precursor gas of the group-V element to the flow of precursor gas of the group-III element, called V/III ratio, being in the range from 5 to 1000.

19. The method of claim 15, wherein the MOCVD step is performed at a pressure in the range from 6.7 kPa to 26.7 kPa.

20. The method of claim 15, wherein the active areas are the areas having most the radiation supplied by the opto-electronic device emitted therefrom or having most the radiation received by the optoelectronic device captured therein.

21. The method of claim 15, wherein the III-V compound is a III-N compound, particularly selected from the group comprising gallium nitride, aluminum nitride, indium nitride, gallium indium nitride, gallium aluminum nitride, aluminum indium nitride, and gallium aluminum indium nitride.

22. The method of claim 15, wherein the semiconductor elements comprise at least first and second semiconductor elements, wherein the active areas comprise first active areas resting on the tops of the first semiconductor elements and configured to emit or to receive a first electromagnetic radiation at a first wavelength and second active areas resting on the tops of the second semiconductor elements and configured to emit or to receive a second electromagnetic radiation at a second wavelength different from the first wavelength.

23. The method of claim 15, wherein the diameter of each first semiconductor element is smaller than the diameter of each second semiconductor element, wherein the first and second active areas comprise a single quantum well or multiple quantum wells and wherein the first wavelength is greater than the second wavelength.

24. The method of claim 15, comprising, before the formation of the active areas, the formation by RPCVD, for each semiconductor element, of a first semiconductor layer on said top made of the III-V compound.

25. The method of claim 15, comprising, after the formation of the active areas, the formation by RPCVD, for each semiconductor element, of a second semiconductor layer on said active area made of the III-V compound.

26. The method of claim 25, comprising, after the formation of the active areas and before the formation of the second semiconductor layers, the formation by RPCVD, for each semiconductor element, of an electron blocking layer of said active area.

* * * * *